United States Patent
Migita et al.

(10) Patent No.: US 8,704,367 B2
(45) Date of Patent: Apr. 22, 2014

(54) SEMICONDUCTOR DEVICE AND MANUFACTURING METHOD OF SEMICONDUCTOR DEVICE

(75) Inventors: Tatsuo Migita, Oita (JP); Hirokazu Ezawa, Tokyo (JP); Soichi Yamashita, Kanagawa (JP); Koro Nagamine, Oita (JP); Masahiro Miyata, Oita (JP); Tatsuo Shiotsuki, Oita (JP); Kiyoshi Muranishi, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 13/224,787

(22) Filed: Sep. 2, 2011

(65) Prior Publication Data
US 2012/0056320 A1 Mar. 8, 2012

(30) Foreign Application Priority Data

Sep. 3, 2010 (JP) .................................. 2010-198379
Sep. 22, 2010 (JP) .................................. 2010-212184

(51) Int. Cl.
*H01L 23/48* (2006.01)
*H01L 23/52* (2006.01)

(52) U.S. Cl.
USPC ..... 257/737; 257/751; 257/753; 257/E23.068

(58) Field of Classification Search
USPC ........................................................ 257/737
See application file for complete search history.

(56) References Cited

U.S. PATENT DOCUMENTS

| | | | |
|---|---|---|---|
| 5,885,891 A * | 3/1999 | Miyata et al. ................. | 438/612 |
| 6,404,051 B1 * | 6/2002 | Ezawa et al. .................. | 257/734 |
| 6,489,229 B1 * | 12/2002 | Sheridan et al. .............. | 438/614 |
| 6,569,752 B1 * | 5/2003 | Homma et al. ................ | 438/597 |
| 6,605,522 B1 * | 8/2003 | Ezawa et al. .................. | 438/613 |
| 6,798,050 B1 * | 9/2004 | Homma et al. ................ | 257/678 |
| 7,538,434 B2 * | 5/2009 | Shih et al. ...................... | 257/751 |
| 7,723,225 B2 * | 5/2010 | Lin et al. ........................ | 438/612 |
| 7,902,679 B2 * | 3/2011 | Lin et al. ........................ | 257/778 |
| 8,466,557 B2 * | 6/2013 | Lin et al. ........................ | 257/753 |
| 2004/0238955 A1 * | 12/2004 | Homma et al. ................ | 257/737 |
| 2007/0184578 A1 * | 8/2007 | Lin et al. ........................ | 438/106 |
| 2010/0117236 A1 * | 5/2010 | Lin et al. ........................ | 257/753 |
| 2012/0049355 A1 * | 3/2012 | Hosokawa et al. ............ | 257/737 |
| 2012/0049356 A1 * | 3/2012 | Migita et al. .................. | 257/737 |
| 2012/0056320 A1 * | 3/2012 | Migita et al. .................. | 257/737 |

FOREIGN PATENT DOCUMENTS

| | | |
|---|---|---|
| JP | 2003-347472 | 12/2003 |
| JP | 2006-237151 A | 9/2006 |
| JP | 2007-103716 | 4/2007 |

OTHER PUBLICATIONS

Japanese Office Action issued Feb. 19, 2013, in Patent Application No. 2010-212184 (with English-language translation).
Combined Office Action and Search Report issued Sep. 17, 2013 in Taiwanese Patent Application No. 100128421 with English language translation and English translation of categories of cited documents.
Office Action issued Feb. 4, 2014 in Japanese Patent Application No. 2010-212184 filed Sep. 22, 2010 (with English Translation).

* cited by examiner

*Primary Examiner* — Earl Taylor
(74) *Attorney, Agent, or Firm* — Oblon, Spivak, McClelland, Maier & Neustadt, L.L.P.

(57) ABSTRACT

According to one embodiment, a semiconductor substrate, a metal film, a surface modifying layer, and a redistribution trace are provided. On the semiconductor substrate, a wire and a pad electrode are formed. The metal film is formed over the semiconductor substrate. The surface modifying layer is formed on a surface layer of the metal film and improves the adhesion with a resist pattern. The redistribution trace is formed on the metal film via the surface modifying layer.

11 Claims, 13 Drawing Sheets

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2010-198379, filed on Sep. 3, 2010 and the prior Japanese Patent Application No. 2010-212184, filed on Sep. 22, 2010; the entire contents all of which are incorporated herein by reference.

FIELD

Embodiments described herein relate generally to a semiconductor device and a manufacturing method of a semiconductor device.

BACKGROUND

In order to achieve high integration and high performance of semiconductor devices, improvement of an operation speed and increase in capacity of memories are required. Accordingly, fine redistribution traces with a pitch of 10 um or less are required also in a redistribution trace forming process on a semiconductor substrate.

If the pitch of redistribution traces is reduced, the adhesion between a resist pattern for patterning a redistribution trace and a base thereunder decreases, which results in causing resist stripping in some cases at the time of resist development or the like.

DETAILED DESCRIPTION

In general, according to one embodiment, a semiconductor substrate, a metal film, a surface modifying layer, and a redistribution trace are provided. On the semiconductor substrate, a wire and a pad electrode are formed. The metal film is formed over the semiconductor substrate. The surface modifying layer is formed on a surface layer of the metal film and improves the adhesion with a resist pattern. The redistribution trace is formed on the metal film via the surface modifying layer.

A semiconductor device and a manufacturing method of a semiconductor device according to the embodiments will be explained below with reference to the drawings. The present invention is not limited to these embodiments.

First Embodiment

FIG. 1A to FIG. 1E, FIG. 2A to FIG. 2D, FIG. 3A to FIG. 3C, FIG. 4A and FIG. 4B, FIG. 5A and FIG. 5B, and FIG. 6A and FIG. 6B are cross-sectional views illustrating a manufacturing method of a semiconductor device according to the first embodiment.

Figure 1A:
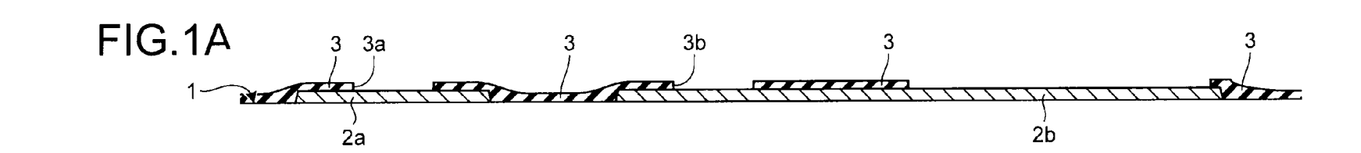
FIG. 1A to FIG. 1E are cross-sectional views illustrating a manufacturing method of a semiconductor device according to a first embodiment.

In FIG. 1A, on a base material layer 1, a pad electrode 2a and a wire 2b are formed and a protective film 3 is formed to cover the pad electrode 2a and the wire 2b. Moreover, in the protective film 3, an opening 3a that exposes the pad electrode 2a and an opening 3b that exposes part of the wire 2b are formed.

As the base material layer 1, for example, a semiconductor substrate on which an integrated circuit, such as a logic circuit or a DRAM, is formed can be used. Moreover, as the material of the pad electrode 2a and the wire 2b, for example, Al or Al-based metal can be used. Furthermore, as the material of the protective film 3, for example, an insulator, such as a silicon oxide film, a silicon oxynitride film, or a silicon nitride film, can be used.

Figure 1B:
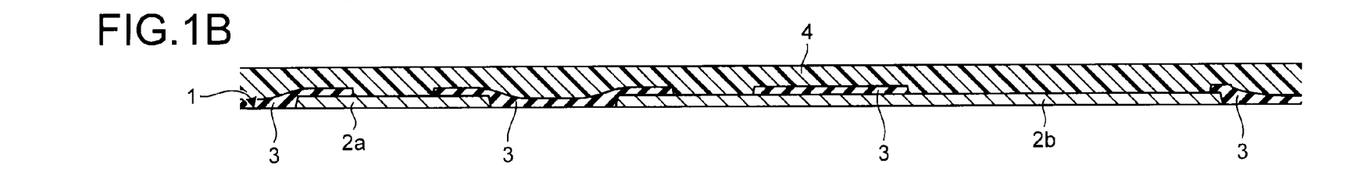

Next, as shown in FIG. 1B, a buffer layer 4 is formed on the protective film 3 by applying photosensitive resin or the like to the protective film 3. As the material of the buffer layer 4, for example, polyimide resin can be used. For reducing wafer stress, it is applicable to use acrylic resin or phenolic resin whose curing temperature is lower than polyimide resin.

Figure 1C:
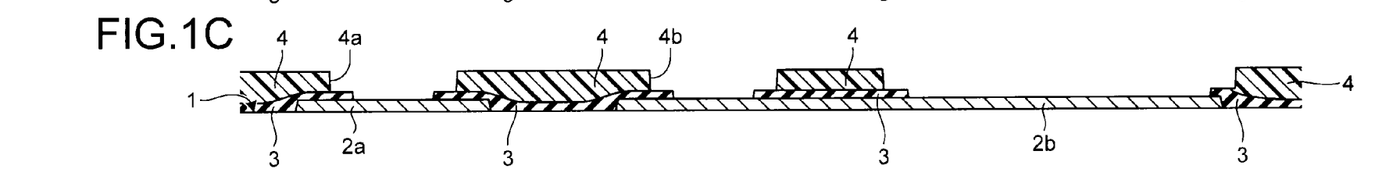

Next, as shown in FIG. 1C, openings 4a and 4b, which expose the pad electrode 2a and part of the wire 2b, respectively, are formed in the buffer layer 4 by using the photolithography technology.

Figure 1D:
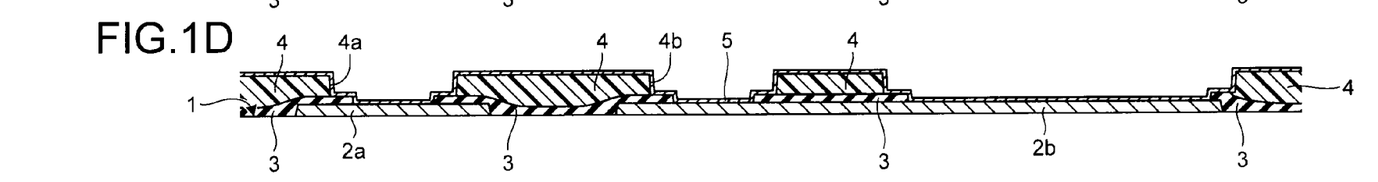

Next, as shown in FIG. 1D, a metal film 5 is formed on the pad electrode 2a, the wire 2b, the protective film 3, and the buffer layer 4 by using a method such as sputtering, plating, CVD, ALD, or vapor deposition. As the metal film 5, an under barrier metal film can be used, and, for example, a stacked structure of Ti and Cu stacked thereon can be used. It is applicable to use a material such as TiN, TiW, W, Ta, Cr, Co, or CoTi instead of Ti. Moreover, it is applicable to use a material such as Al, Pd, Au, or Ag instead of Cu.

Figure 1E:
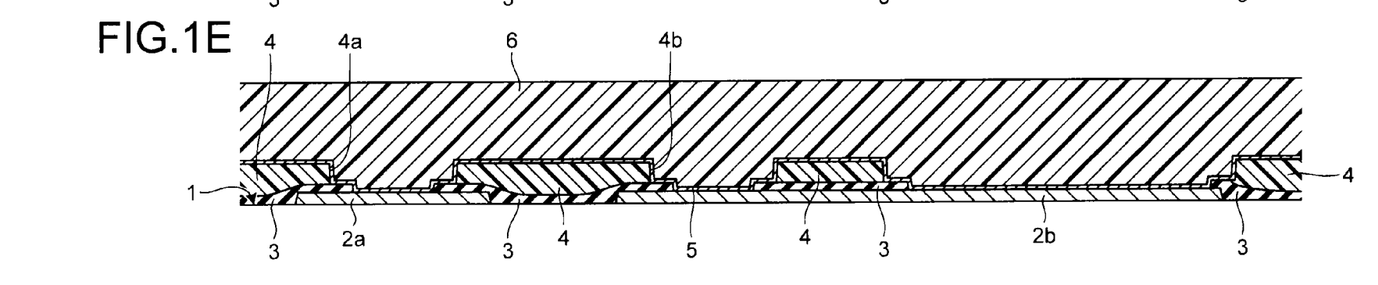

Next, as shown in FIG. 1E, a resist film 6 is formed on the metal film 5 by using a method such as spin coating. The resist film 6 is such that the absorbance is set to 80% or less with respect to light that reaches the interface (hereinafter, base interface) with the metal film 5. The absorbance in the present invention is a value measured by using an exposure apparatus with i-line wavelength (365 nm). The film thickness of the resist film 6 can be set within a range of 1 to 50 μm.

Figure 2A:
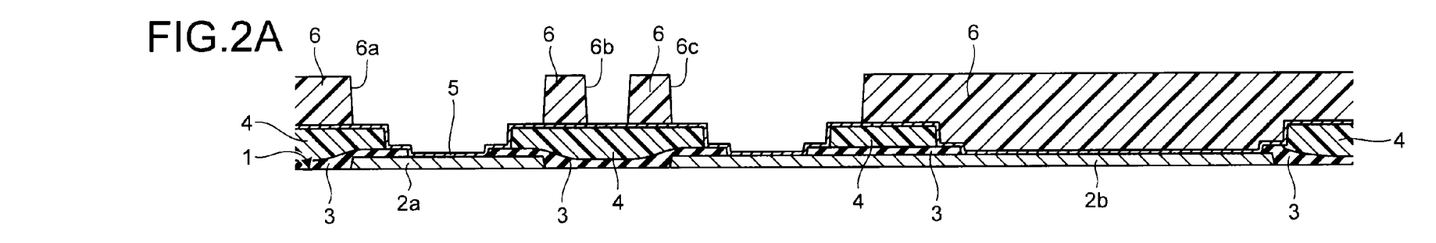
FIG. 2A to FIG. 2D are cross-sectional views illustrating the manufacturing method of the semiconductor device according to the first embodiment.

Next, as shown in FIG. 2A, openings 6a to 6c are formed in the resist film 6 by performing exposure and development on the resist film 6. The opening 6a can be arranged over the pad electrode 2a, the opening 6b can be arranged over the buffer layer 4, and the opening 6c can be arranged over the wire 2b. The width of the resist film 6 in which the opening 6b is formed can be 20 μm or less.

Figure 2B:
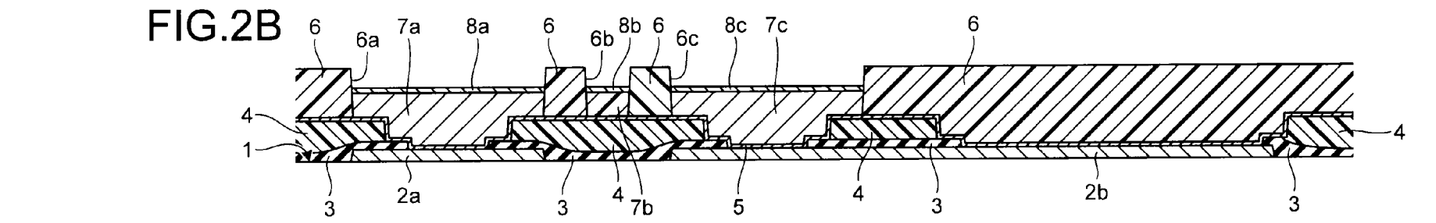

Next, as shown in FIG. 2B, redistribution traces 7a to 7c are formed on the pad electrode 2a, the buffer layer 4, and the wire 2b, respectively, via the metal film 5 by embedding a first conductor in the openings 6a to 6c by electroplating. Moreover, surface layers 8a to 8c are formed on the redistribution traces 7a to 7c, respectively, by embedding a second conductor in the openings 6a to 6c by electroplating. The redistribution trace 7a can be used for connection with the pad electrode 2a. The redistribution trace 7c can be used for connection with the wire 2b. The redistribution trace 7b can be used, for example, for routing the redistribution trace 7a and 7c on the buffer layer 4.

For the surface layers 8a to 8c, a material having a higher etch resistance than the redistribution traces 7a to 7c can be used. For example, the material of the redistribution traces 7a to 7c can be Cu or Cu-based metal, and the material of the surface layers 8a to 8c can be selected from at least any one of Ni, Mn, Ta, Zn, Cr, Co, Sn, and Pb. Moreover, desirably, the width of the redistribution trace 7b is 20 μm or less and the half pitch of the redistribution trace 7b is 40 μm or less.

Figures 2C, 2D:
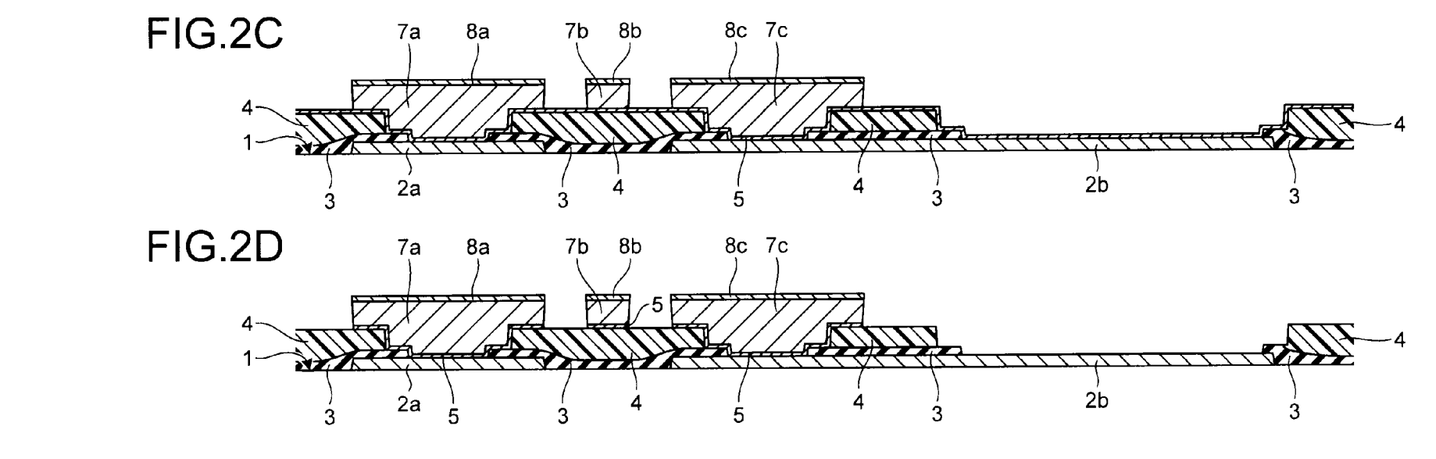

Next, as shown in FIG. 2C, the resist film 6 on the metal film 5 is removed by a method such as ashing.

The absorbance of the resist film 6 is set to 80% or less with respect to light having a wavelength of 365 nm, so that the degree of crosslinking at the base interface of the resist film 6 can be increased while suppressing increase in the degree of crosslinking on the surface of the resist film 6 at the time of exposure of the resist film 6. Therefore, the adhesion with the base interface of the resist film 6 can be improved while suppressing excessive curing of the surface of the resist film 6, so that even when the width of the resist film 6 in which the opening 6b is formed is small, the resist film 6 can be suppressed from stripping at the time of development and moreover, even when there is a wide resist film 6 in other areas, the resist film 6 can be removed after forming the redistribution traces 7a to 7c.

If the remaining width of the resist film 6 is 20 μm or less, stripping becomes severe significantly, so that the remaining width is preferably 20 μm or less. The half pitch is preferably 40 μm or less.

Next, as shown in FIG. 2D, the metal film 5 is etched with the redistribution traces 7a to 7c as a mask, thereby removing the metal film 5 around the redistribution traces 7a to 7c.

Figure 3A:
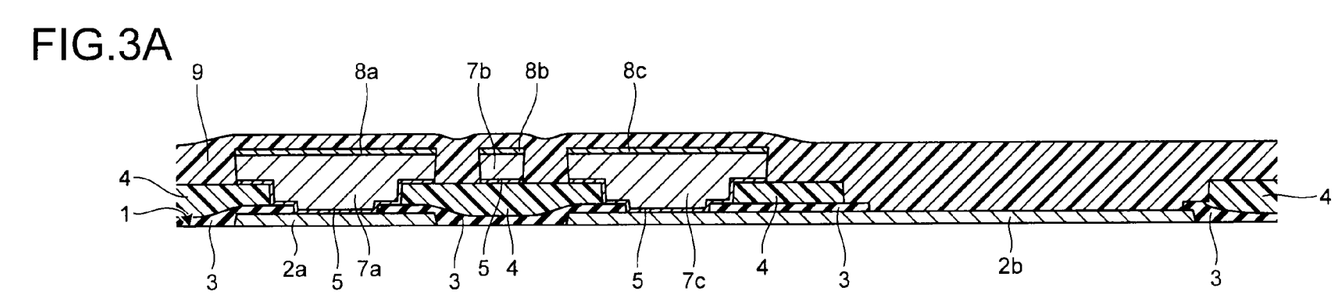
FIG. 3A to FIG. 3C are cross-sectional views illustrating the manufacturing method of the semiconductor device according to the first embodiment.

Next, as shown in FIG. 3A, a buffer layer 9 is formed on the wire 2b, the buffer layer 4, and the surface layers 8a to 8c by applying photosensitive resin or the like to the wire 2b, the buffer layer 4, and the surface layers 8a to 8c. As the material of the buffer layer 9, for example, polyimide resin can be used. For reducing wafer stress, it is applicable to use acrylic resin or phenolic resin whose curing temperature is lower than polyimide resin.

Figure 3B:
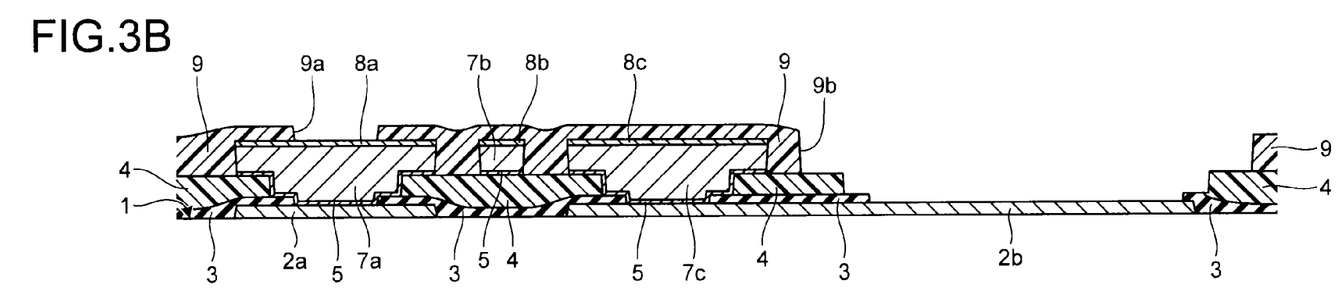

Next, as shown in FIG. 3B, openings 9a and 9b, which expose the surface layer 8a over the pad electrode 2a and part of the wire 2b, respectively, are formed in the buffer layer 9 by using the photolithography technology.

Figure 3C:
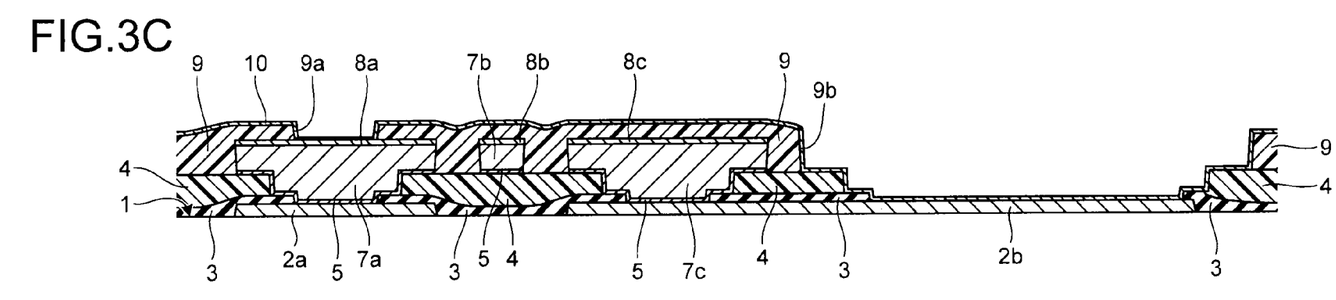

Next, as shown in FIG. 3C, a metal film 10 is formed on the wire 2b, the protective film 3, the buffer layers 4 and 9, and the surface layer 8a by using a method such as sputtering, plating, CVD, ALD, or vapor deposition. As the metal film 10, for example, a stacked structure of Ti and Cu stacked thereon can be used.

Figure 4A:
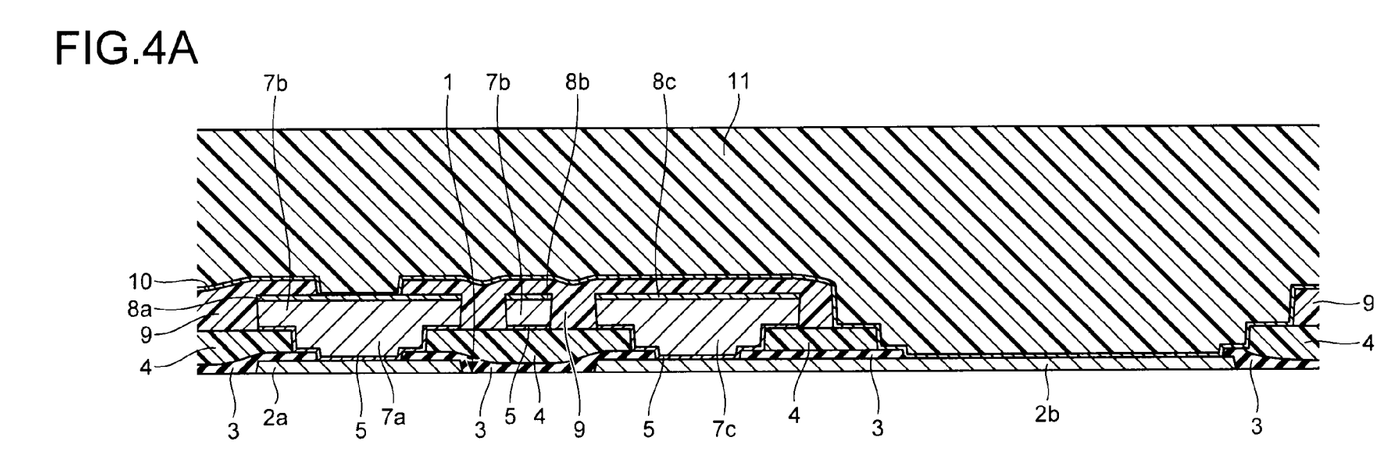
FIG. 4A and FIG. 4B are cross-sectional views illustrating the manufacturing method of the semiconductor device according to the first embodiment.

Next, as shown in FIG. 4A, a resist film 11 is formed on the metal film 10 by using a method such as spin coating.

Figure 4B:
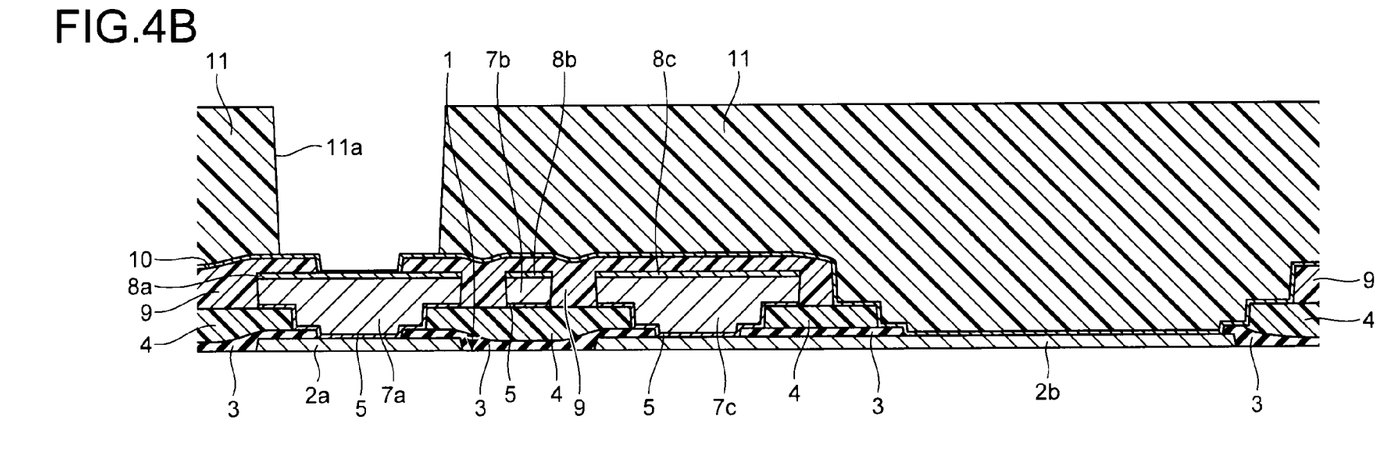

Next, as shown in FIG. 4B, an opening 11a, which exposes the surface layer 8a over the pad electrode 2a, is formed in the resist film 11 by performing exposure and development on the resist film 11.

Figure 5A:
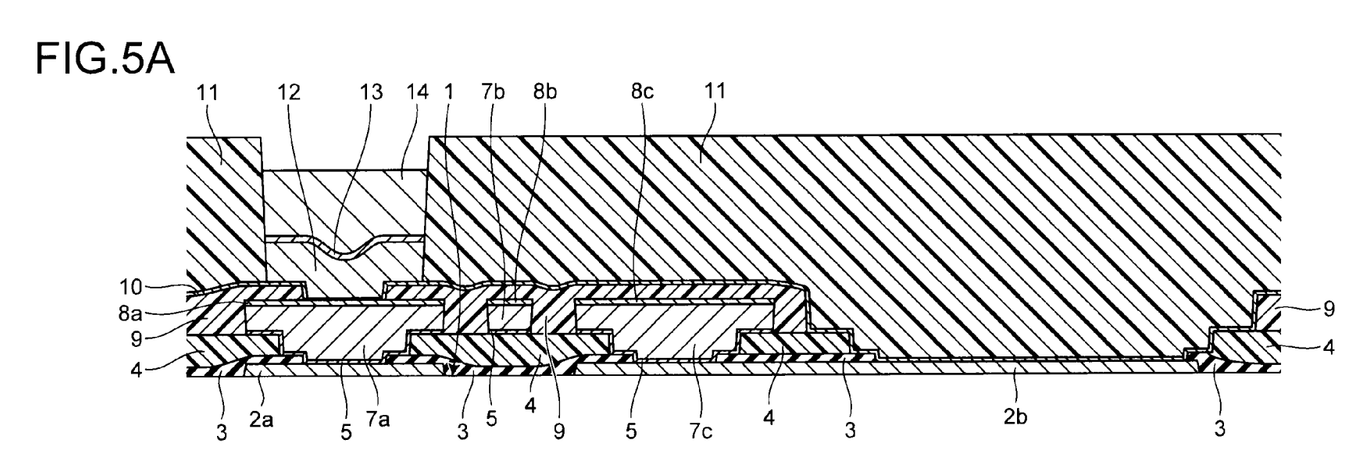
FIG. 5A and FIG. 5B are cross-sectional views illustrating the manufacturing method of the semiconductor device according to the first embodiment.

Next, as shown in FIG. 5A, a bump electrode is formed on the surface layer 8a via the metal film 10 by sequentially embedding a barrier layer 12 and solder layers 13 and 14 in the opening 11a by electroplating. For example, Ni can be used for the material of the barrier layer 12, Cu can be used for the material of the solder layer 13, and Sn can be used for the material of the solder layer 14.

Figure 5B:
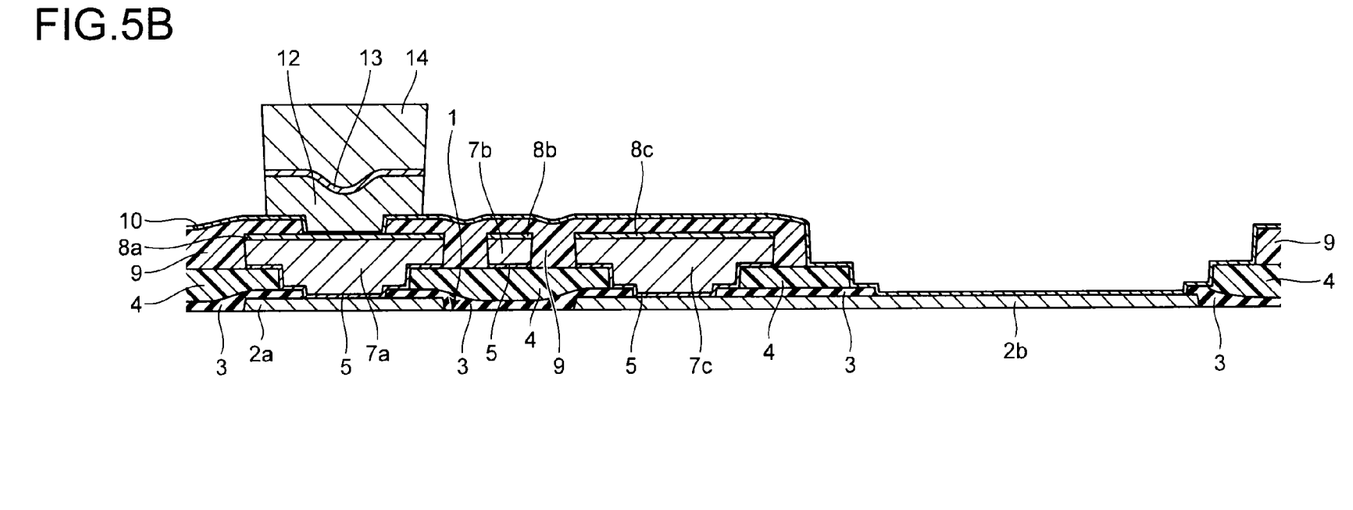

Next, as shown in FIG. 5B, the resist film 11 on the metal film 10 is removed by a method such as ashing.

Figure 6A:
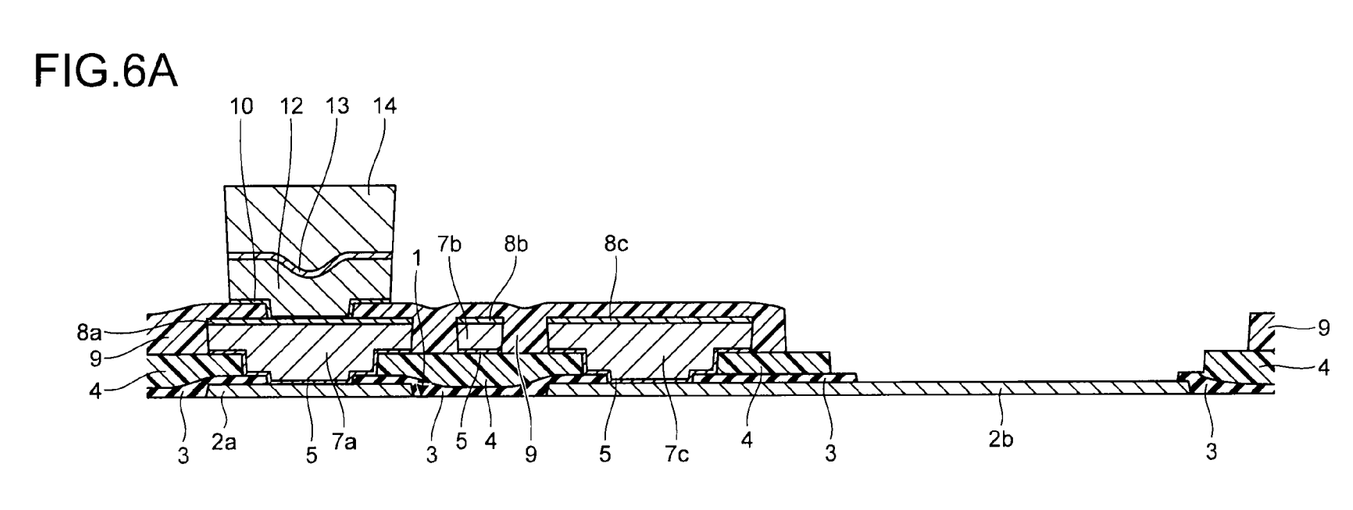
FIG. 6A and FIG. 6B are cross-sectional views illustrating the manufacturing method of the semiconductor device according to the first embodiment.

Next, as shown in FIG. 6A, the metal film 10 is etched with the bump electrode formed of the barrier layer 12 and the solder layers 13 and 14 as a mask, thereby removing the metal film 10 around the bump electrode formed of the barrier layer 12 and the solder layers 13 and 14.

Figure 6B:
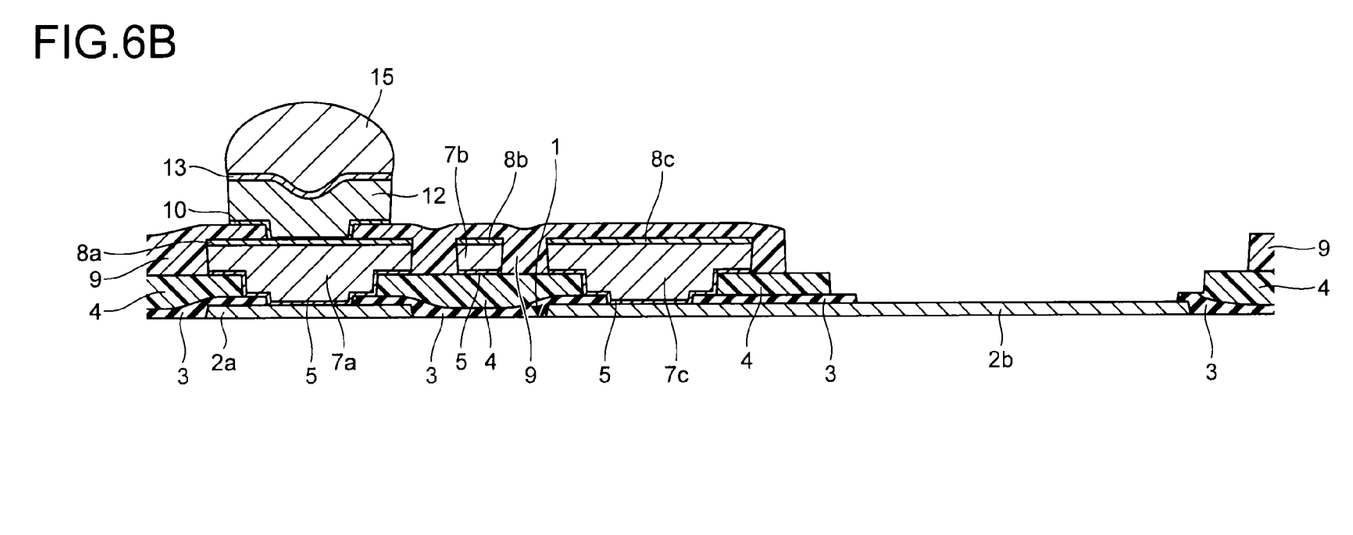

Next, as shown in FIG. 6B, the solder layers 13 and 14 are reflowed, so that the solder layers 13 and 14 are alloyed to form an alloy solder layer 15 on the barrier layer 12.

The above processes can be performed in a state where the base material layer 1 is a wafer. Then, after the above processes, semiconductor chips can be cut out by singulating this wafer.

In the above embodiment, the method of using a solder ball as the bump electrode is explained, however, a nickel bump, a gold bump, a copper bump, or the like can be used instead. Moreover, in the above embodiment, explanation is given for the method of using a stacked structure of Ti and Cu as the metal films 5 and 10, however, Ti or Cu can be used alone, Cr, Pt, W, or the like can be used alone, or a stacked structure of these metals can be used.

Furthermore, as a joining method of the bump electrode, metal joint, such as solder joint and alloy joint, can be used, or ACF (Anisotropic Conductive Film) bonding, NCF (Nonconductive Film) bonding, ACP (Anisotropic Conductive Paste) bonding, NCP (Nonconductive Paste) bonding, or the like can be used.

Figure 7:
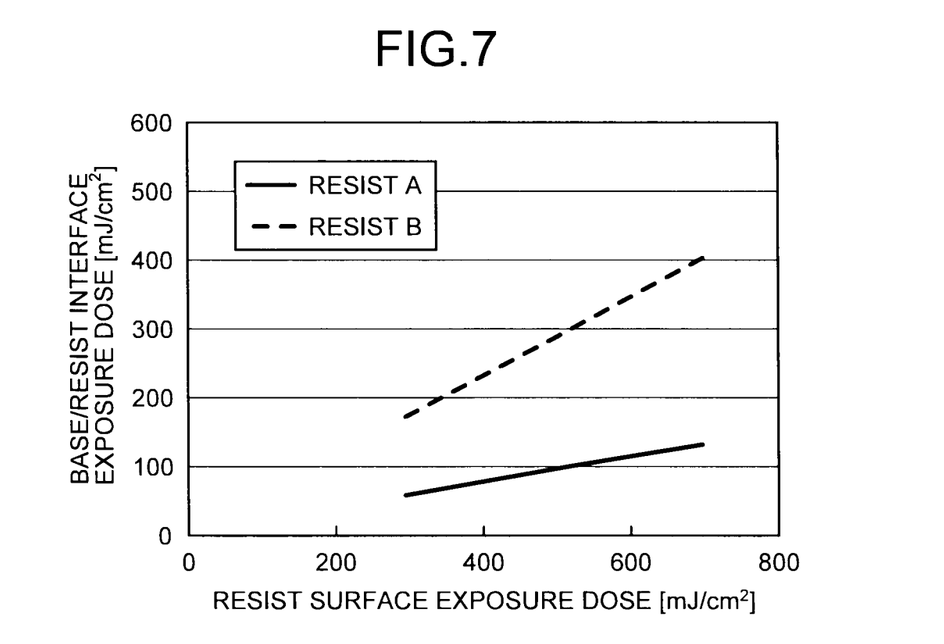
FIG. 7 is a diagram illustrating a relationship between exposure doses on a surface and a lower surface of resists A and B having different absorbance according to the first embodiment.

FIG. 7 is a diagram illustrating a relationship between exposure doses on a surface and a lower surface of resists A and B having different absorbance according to the first embodiment. The absorbance of the resist A is set to 81% and the absorbance of the resist B is set to 42% with respect to light having a wavelength of 365 nm. Moreover, the film thickness of the resists A and B is set to 10 μm. Furthermore, a Cu film is used as the base underlying the resists A and B.

In FIG. 7, the exposure dose at the interface with the base decreases in the resist A compared with the resist B even if the exposure dose is the same on the surfaces. Therefore, in the resist A, if the exposure dose at the interface with the base is increased for improving the adhesion with the base, overexposure occurs on the surface, so that excessive curing of the surface occurs.

On the other hand, in the resist B, the exposure dose at the interface with the base can be increased without increasing the exposure dose on the surface, so that the adhesion with the base can be improved while preventing overexposure on the surface.

Next, a half pitch pattern of line & space of 3/3 µm to 15/15 µm is formed, and the relationship between the surface exposure dose of the resists A and B having different absorbance according to the first embodiment and the resist remaining width with which stripping occurs is checked.

As a result, it is found that, for example, for forming a resist pattern having a width of 5 µm without stripping, in the resist A, the exposure dose of 600 mJ/cm$^2$ or more is needed on the surface and therefore excessive curing of the surface occurs, so that the removability of the resist pattern decreases.

On the other hand, in the resist B, for forming a resist pattern having a width of 5 µm without stripping, the exposure dose of about 400 mJ/cm$^2$ on the surface is sufficient and therefore excessive curing of the surface can be prevented, so that decrease in removability of the resist pattern can be prevented.

Moreover, the relationship between the lower-surface exposure dose of the resists A and B having different absorbance according to the first embodiment and the resist remaining width with which stripping occurs is checked. For example, for forming a resist pattern having a width of 5 µm without stripping, in the resist A, the exposure dose of about 120 mJ/cm$^2$ is needed at the interface with the base. For obtaining the exposure dose of about 120 mJ/cm$^2$ at the interface with the base, the exposure dose of about 600 mJ/cm$^2$ is needed on the surface referring to FIG. 7 and therefore excessive curing of the surface occurs, so that the removability of the resist pattern decreases. In other words, it is found that because the absorbance exceeds 80% with respect to light having a wavelength of 365 nm in the resist A, the effect of the present invention cannot be obtained.

On the other hand, in the resist B, for forming a resist pattern having a width of 5 µm with without stripping, the exposure dose of about 200 mJ/cm$^2$ is needed at the interface with the base. For obtaining the exposure dose of about 200 mJ/cm$^2$ at the interface with the base, the exposure dose of about 400 mJ/cm$^2$ is sufficient on the surface referring to FIG. 7 and therefore excessive curing of the surface can be prevented, so that decrease in removability of the resist pattern can be prevented. In other words, it is found that, in the resist B in which the absorbance is 42% with respect to light having a wavelength of 365 nm, the effect of the present invention can be obtained. Therefore, the absorbance of the resist film 6 in the present invention is set to 80% or less, preferably 60% or less, and more preferably 50% or less with respect to light having a wavelength of 365 nm.

In the resist A, when the exposure dose is 400 mJ/cm$^2$, stripping does not occur in the case where the line & space is 10 µm or more. Moreover, in the resist A, when the exposure dose is 600 mJ/cm$^2$, stripping does not occur in the case where the line & space is 6 µm or more.

On the other hand, in the resist B, when the exposure dose is 400 mJ/cm$^2$, stripping does not occur in the case where the line & space is 5 µm or more. Moreover, in the resist B, when the exposure dose is 600 mJ/cm$^2$, stripping does not occur in the case where the line & space is 3 µm or more.

Second Embodiment

In the above first embodiment, explanation is given for the method of setting the absorbance of the resist film 6 to 80% or less with respect to light having the wavelength of 365 nm for preventing stripping of a resist pattern, however, it is applicable to reduce the solubility of the resist film 6 at the time of development to 1 µm/min or less. As the method of reducing the solubility of the resist film 6 at the time of development, it is possible to reduce alkali-soluble groups of the resist material.

Developer can be suppressed from penetrating the interface between the resist film 6 and the base by reducing the solubility of the resist film 6 at the time of development, so that stripping of a resist pattern can be reduced.

The relationship between the development time of resists C and D having different solubility according to the second embodiment and the resist remaining film thickness is checked. The conditions are as follows. Negative resist is used as the resists C and D, resist in which alkali-soluble groups are reduced by about 30% with respect to the resist C is used as the resist D, the film thickness of the resists C and D is set to 10 µm, and an Si substrate is used for the base.

As a result, whereas the development rate of the resist D is 2 µm/min, the development rate of the resist C is 0.67 µm/min. When this resist C is used, stripping of a resist pattern can be reduced compared with the case of using the resist D.

Third Embodiment

FIG. 8A to FIG. 8E, FIG. 9A to FIG. 9D, FIG. 10A to FIG. 10C, FIG. 11A and FIG. 11B, FIG. 12A and FIG. 12B, and FIG. 13A and FIG. 13B are cross-sectional views illustrating a manufacturing method of a semiconductor device according to the third embodiment.

Figures 8A, 8B:
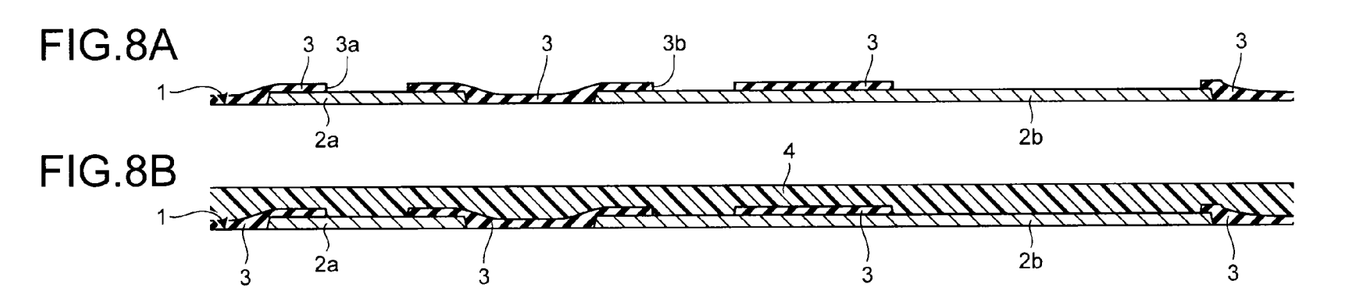
FIG. 8A to FIG. 8E are cross-sectional views illustrating a manufacturing method of a semiconductor device according to a third embodiment.
Figure 8C:
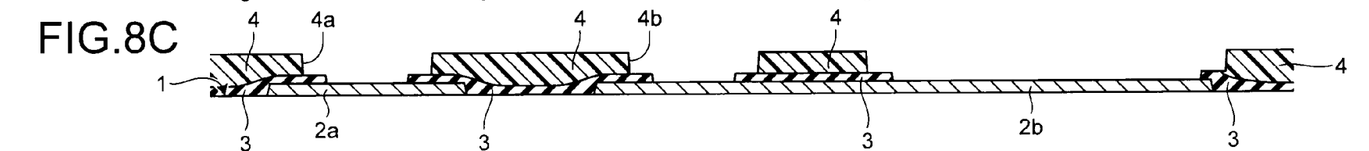
Figure 8D:
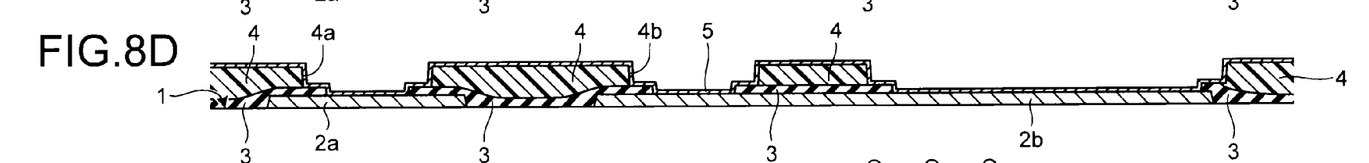
Figure 8E:
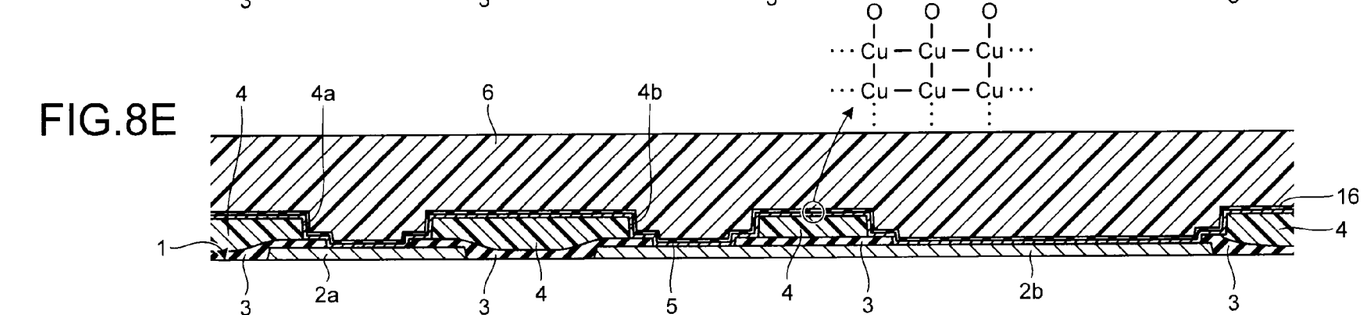
Figure 9A:
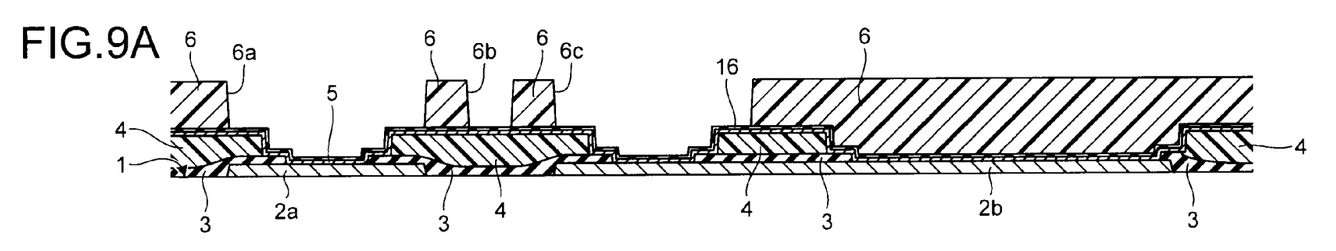
FIG. 9A to FIG. 9D are cross-sectional views illustrating the manufacturing method of the semiconductor device according to the third embodiment.
Figure 9B:
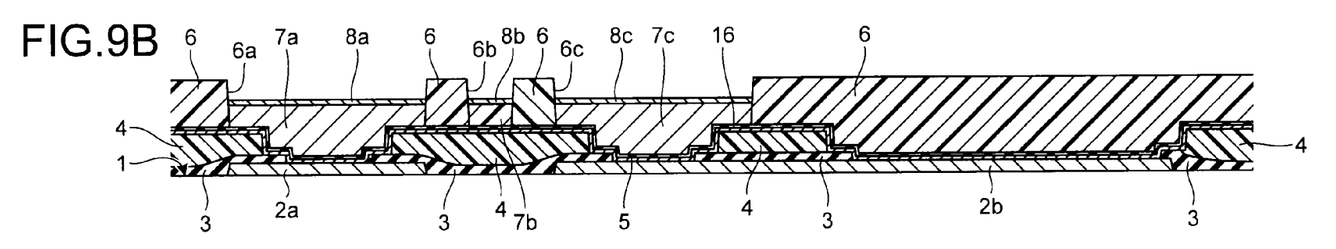
Figure 9C:
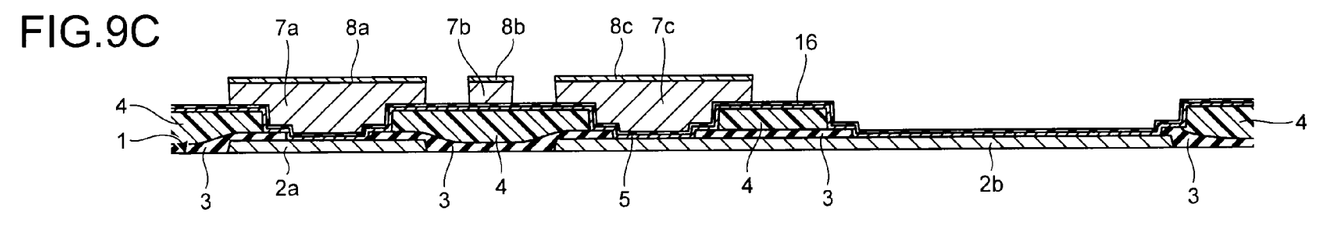
Figure 9D:
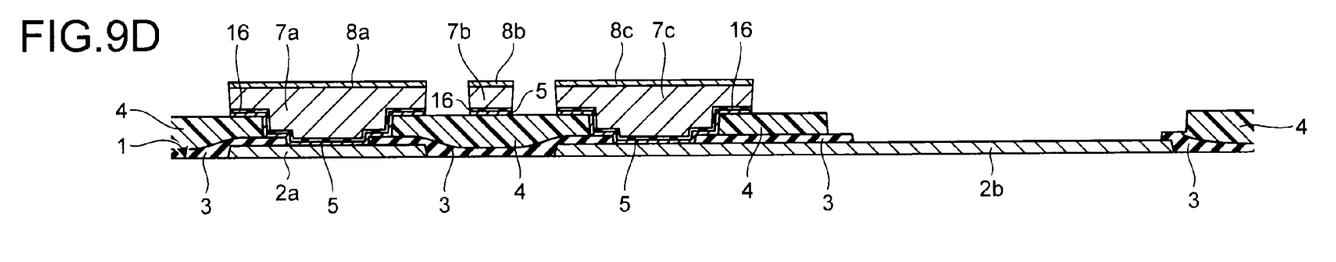
Figure 10A:
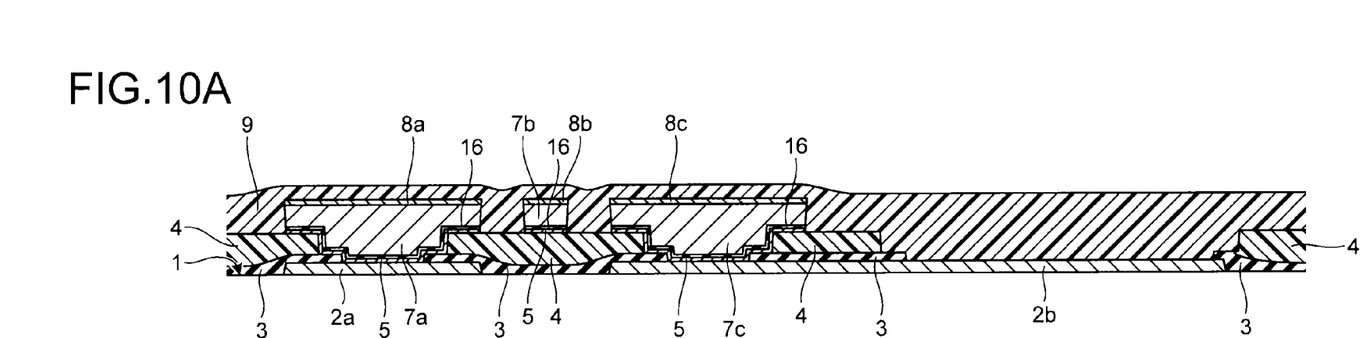
FIG. 10A to FIG. 10C are cross-sectional views illustrating the manufacturing method of the semiconductor device according to the third embodiment.
Figure 10B:
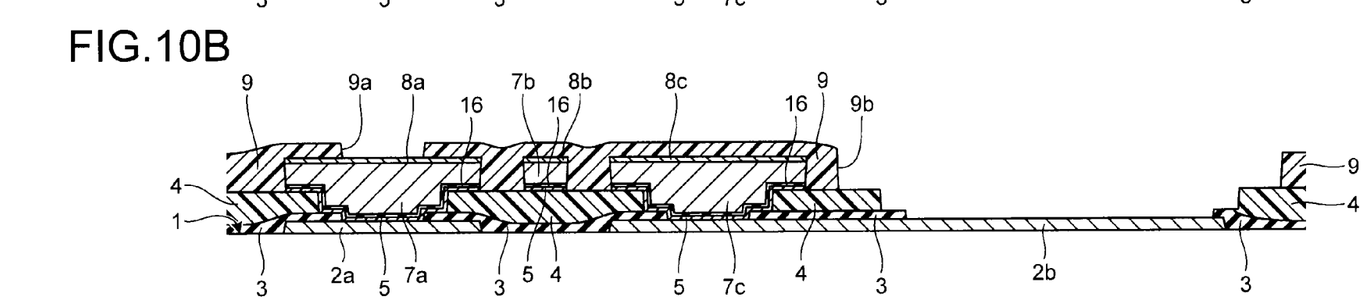
Figure 10C:
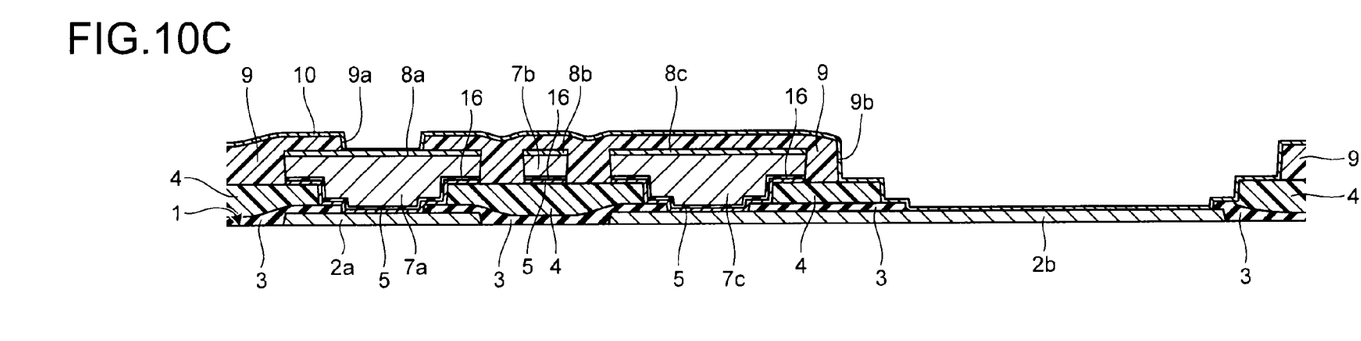
Figure 11A:
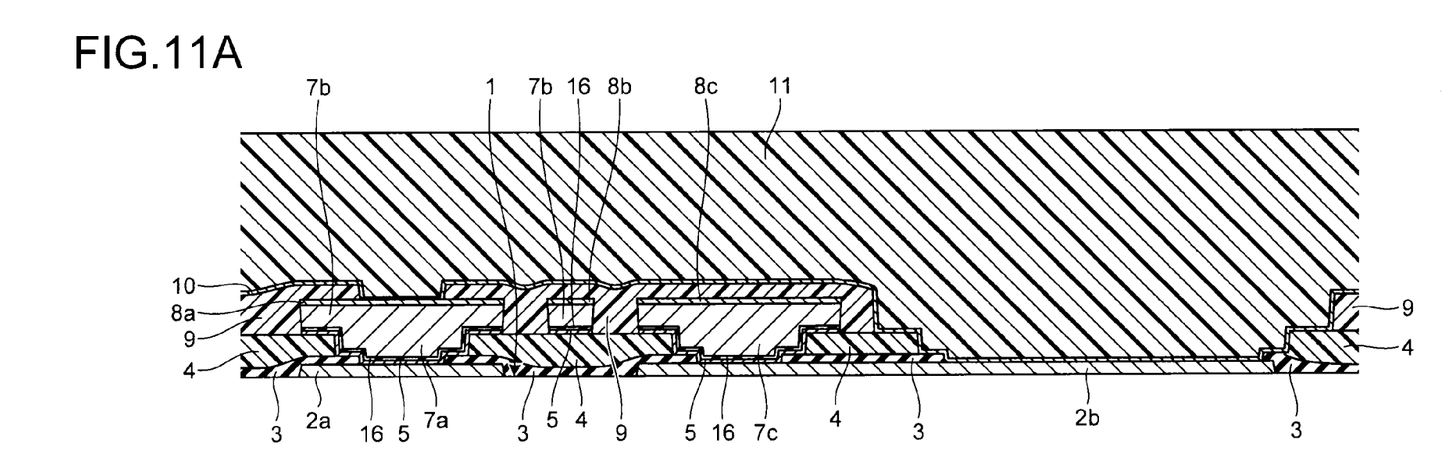
FIG. 11A and FIG. 11B are cross-sectional views illustrating the manufacturing method of the semiconductor device according to the third embodiment.
Figure 11B:
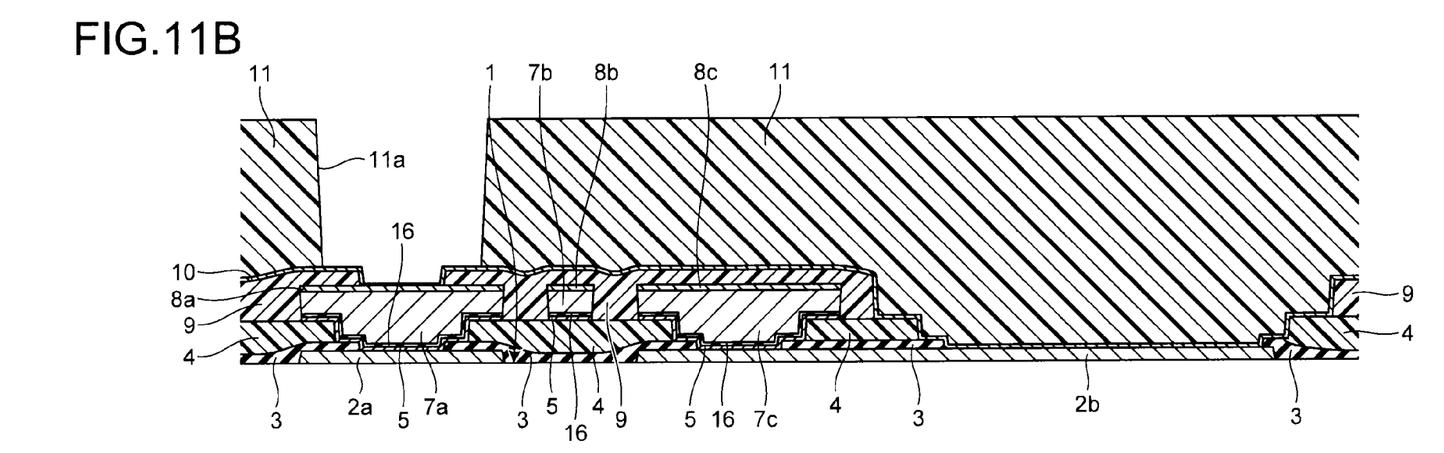
Figure 12A:
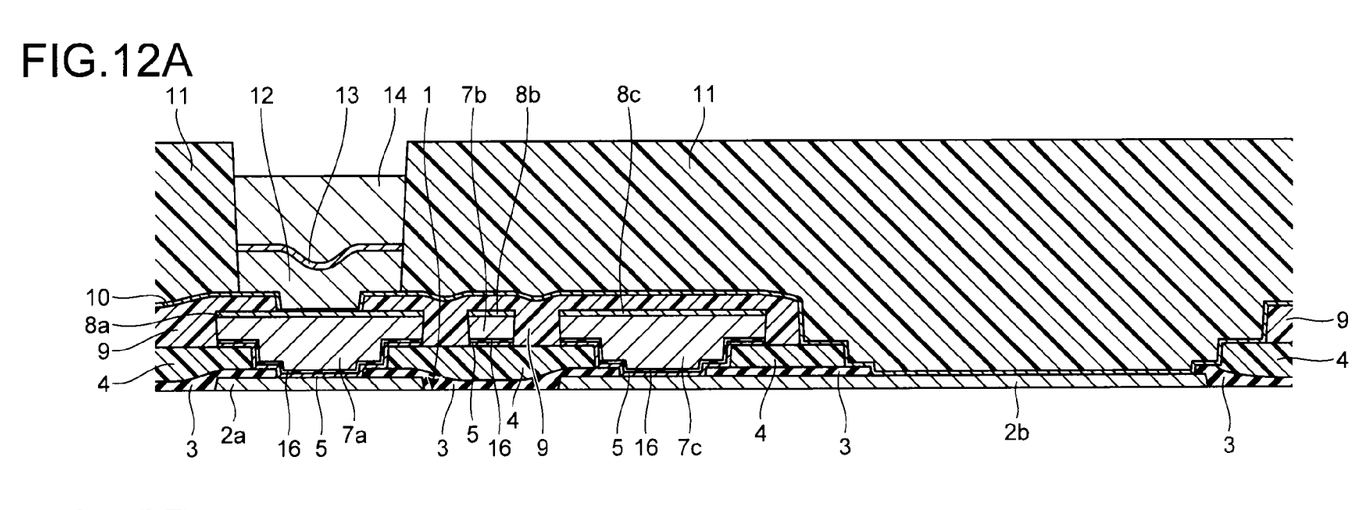
FIG. 12A and FIG. 12B are cross-sectional views illustrating the manufacturing method of the semiconductor device according to the third embodiment.
Figure 12B:
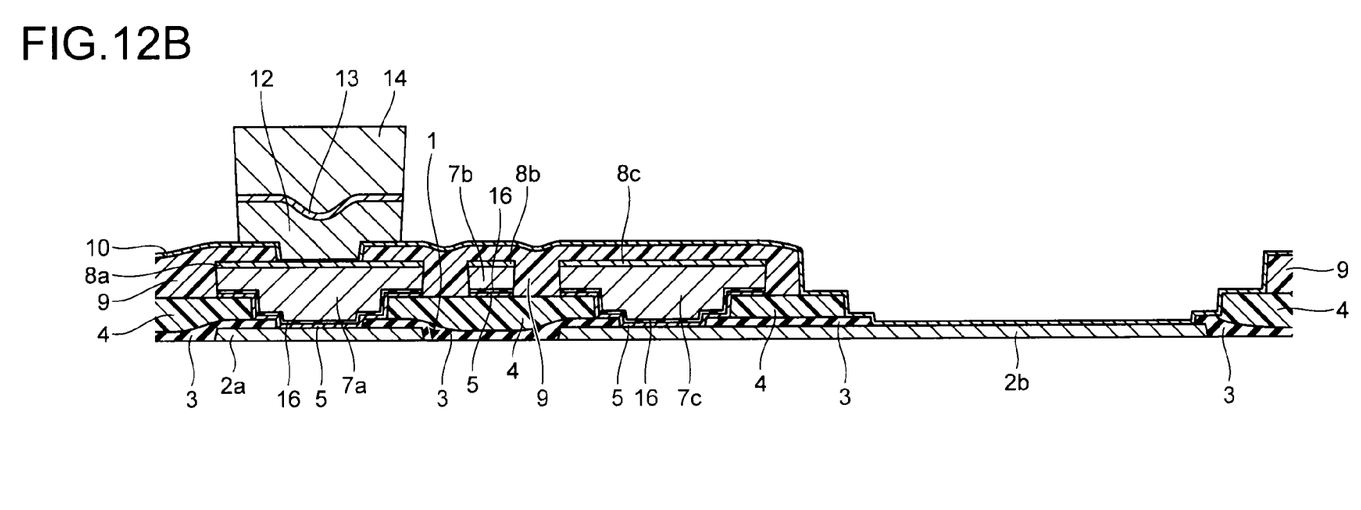
Figure 13A:
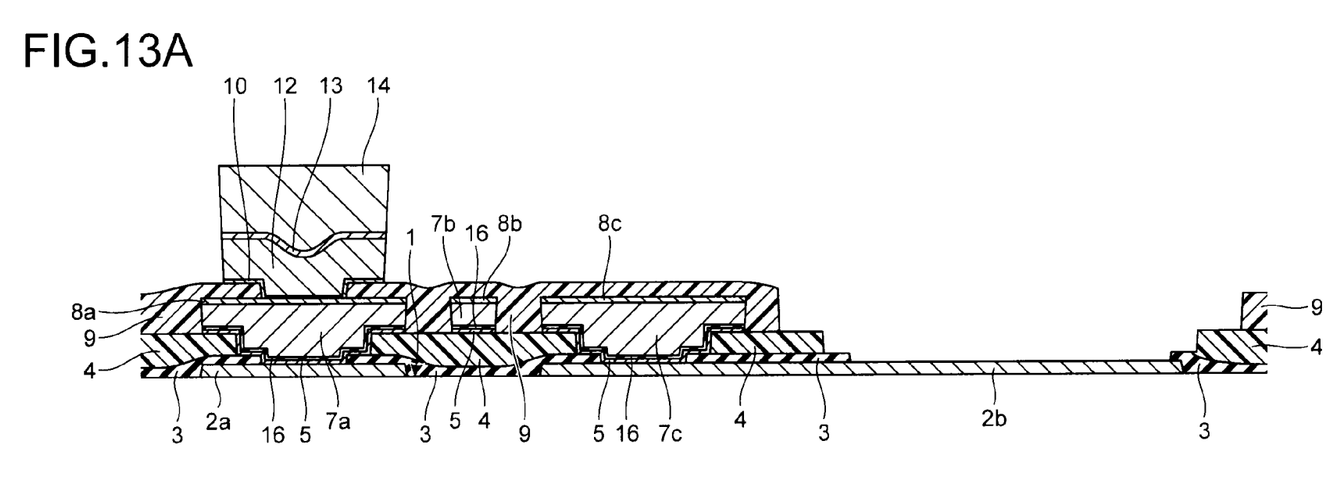
FIG. 13A and FIG. 13B are cross-sectional views illustrating the manufacturing method of the semiconductor device according to the third embodiment.
Figure 13B:
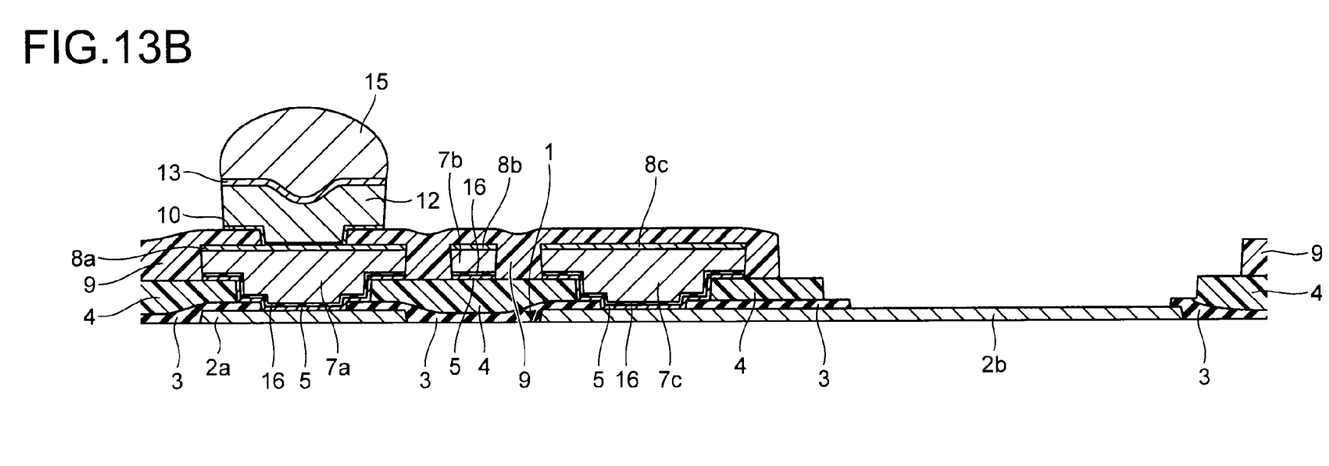

In this third embodiment, in the process of FIG. 8E, a surface modifying layer 16 that improves the adhesion with the resist film 6 is formed on the metal film 5 before forming the resist film 6 on the metal film 5.

When the surface of the metal film 5 is Cu, a Cu oxide film can be used as the surface modifying layer 16. As the Cu oxide film, CuO is preferable and Cu$_2$O is more preferable. It is sufficient that the surface modifying layer 16 is present on the metal film 5 and the film thickness of the surface modifying layer 16 can be as small as about a few nm.

When a Cu oxide film is used as the surface modifying layer 16, the surface of Cu can be terminated with O, enabling to improve the adhesion with the resist film 6.

The method of forming the Cu oxide film on a Cu film includes a method of performing a heat treatment in an oxidizing atmosphere. The room temperature or higher is sufficient for the temperature in this heat treatment. However, for shortening the formation time of the Cu oxide film, the temperature in the heat treatment is preferably set to a few hundred degrees Celsius or higher.

In FIG. 8A to FIG. 8E, FIG. 9A to FIG. 9D, FIG. 10A to FIG. 10C, FIG. 11A and FIG. 11B, FIG. 12A and FIG. 12B, and FIG. 13A and FIG. 13B, the processes similar to FIG. 1A to FIG. 1E, FIG. 2A to FIG. 2D, FIG. 3A to FIG. 3C, FIG. 4A and FIG. 4B, FIG. 5A and FIG. 5B, and FIG. 6A and FIG. 6B can be performed except for the method of forming the surface modifying layer 16 on the metal film 5 in the process in FIG. 8E.

The resist remaining width with which stripping occurs in the case of different base surface states according to the third embodiment is checked with the surface exposure dose of 300 mJ/cm$^2$. When a resist pattern is directly formed on the Cu film, the strip-resistant resist remaining width is about 6 µm. On the other hand, when a resist pattern is formed after forming the Cu oxide film as the surface modifying layer on the Cu film by a heat treatment, the strip-resistant resist remaining width is about 3 μm. Therefore, it is found that resist stripping can be suppressed by providing the surface modifying layer.

As this resist pattern, a half pitch pattern of line & space of 3/3 μm to 15/15 μm is used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate on which a wire and a pad electrode are formed;
   a metal film formed over the semiconductor substrate;
   a surface modifying layer formed on a surface layer of the metal film;
   a redistribution trace formed on the metal film via the surface modifying layer;
   a protective film formed on the semiconductor substrate to cover the wire and the pad electrode;
   a first opening that is formed in the protective film and exposes the pad electrode;
   a second opening that is formed in the protective film and exposes part of the wire;
   a first buffer layer formed on the protective film;
   a third opening that is formed in the first buffer layer and exposes the pad electrode through the first opening;
   a fourth opening that is formed in the first buffer layer and exposes part of the wire through the second opening; and
   a first under barrier metal film formed between the first buffer layer and the redistribution trace, wherein
   the protective film is an inorganic insulator and the first buffer layer is resin,
   the resin is selected from polyimide resin, acrylic resin, and phenolic resin, and
   the redistribution trace includes
   a first redistribution trace connected to the pad electrode through the first opening and the third opening,
   a second redistribution trace connected to the wire through the second opening and the fourth opening, and
   a third redistribution trace formed over the first buffer layer.

2. The semiconductor device according to claim 1, wherein the metal film has a stacked structure in which a lower layer is selected from any of Ti, TiN, TiW, W, Ta, Cr, and CoTi and the surface layer is a selected from any of Cu, Al, Pd, Au, and Ag, and
   the surface modifying layer is a Cu oxide film.

3. The semiconductor device according to claim 1, further comprising a surface layer formed on the redistribution trace.

4. The semiconductor device according to claim 3, wherein a material of the redistribution trace is Cu and a material of the surface layer formed on the redistribution trace is selected from at least any one of Mn, Ta, Ni, Zn, Cr, Co, Sn and Pb.

5. The semiconductor device according to claim 1, wherein an integrated circuit is formed on the semiconductor substrate.

6. The semiconductor device according to claim 1, further comprising:
   a second buffer layer formed over the first redistribution trace, the second redistribution trace, and the third redistribution trace; and
   a fifth opening that is formed in the second buffer layer and exposes the first redistribution trace.

7. The semiconductor device according to claim 6, further comprising a bump electrode connected to the first redistribution trace through the fifth opening.

8. The semiconductor device according to claim 7, wherein the bump electrode is formed of an alloy solder layer.

9. The semiconductor device according to claim 8,
   further comprising a second under barrier metal film formed between the second buffer layer and the bump electrode.

10. The semiconductor device according to claim 9, wherein the second buffer layer is resin.

11. The semiconductor device according to claim 10, wherein the resin is selected from polyimide resin, acrylic resin, and phenolic resin.

* * * * *